United States Patent
Noda

(10) Patent No.: US 10,321,618 B2
(45) Date of Patent: Jun. 11, 2019

(54) TAPE FEEDER

(75) Inventor: Akihiro Noda, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 718 days.

(21) Appl. No.: 14/384,305

(22) PCT Filed: Mar. 22, 2012

(86) PCT No.: PCT/JP2012/057372
§ 371 (c)(1),
(2), (4) Date: Sep. 10, 2014

(87) PCT Pub. No.: WO2013/140581
PCT Pub. Date: Sep. 26, 2013

(65) Prior Publication Data
US 2015/0060478 A1     Mar. 5, 2015

(51) Int. Cl.
*H05K 13/04*     (2006.01)
*B65H 20/22*     (2006.01)

(52) U.S. Cl.
CPC ..... *H05K 13/0417* (2013.01); *H05K 13/0419* (2018.08); *B65H 20/22* (2013.01)

(58) Field of Classification Search
CPC .......... Y10T 29/53465; H05K 13/0417; G11B 15/093; G11B 15/16; G11B 15/1883
See application file for complete search history.

(56) References Cited

U.S. PATENT DOCUMENTS 3,738,078 A * 6/1973 Schaaf .................... B65B 19/34
                                                                53/236
5,742,447 A * 4/1998 Kunze .................. G11B 15/442
                                                                360/96.2

(Continued)

FOREIGN PATENT DOCUMENTS

JP       11 135986       5/1999
JP      2003 188591      7/2003

(Continued)

OTHER PUBLICATIONS

International Search Report dated Apr. 17, 2012 in PCT/JP12/057372 Filed Mar. 22, 2012.

(Continued)

*Primary Examiner* — Gene O Crawford
*Assistant Examiner* — Kelvin L Randall, Jr.
(74) *Attorney, Agent, or Firm* — Oblon, McClelland, Maier & Neustadt, L.L.P.

(57)     ABSTRACT

A motor related to a reel cassette among a plurality of the reel cassettes, in the condition where there is a shortage of a component in a component supply tape and an error has occurred (for example, a component adsorption error, or an image processing error) attributable to the supplied component, is operated so that a sprocket driving mechanism portion is lowered against a spring, a sprocket is lowered to a retract position, engagement of the sprocket with a sprocket hole of the component supply tape is released, and a clamp state of the reel cassette is released with a clamp member retracted downward from the reel cassette. Moreover, a display unit of an operation panel displays that only the reel cassette subjected to automatic clamp release is in a clamp release state.

6 Claims, 14 Drawing Sheets

(56) References Cited

U.S. PATENT DOCUMENTS

| | | | | |
|---|---|---|---|---|
| 6,202,728 | B1* | 3/2001 | Takada | H05K 13/02 156/701 |
| 6,269,860 | B1* | 8/2001 | Ishikawa | H05K 13/0417 156/701 |
| 6,513,563 | B1* | 2/2003 | Ando | H05K 13/021 156/538 |
| 6,910,514 | B2* | 6/2005 | Endo | H05K 13/02 156/701 |
| 7,131,478 | B2* | 11/2006 | Endo | H05K 13/02 156/247 |
| 7,254,878 | B2* | 8/2007 | Suzuki | G03B 17/26 29/407.01 |
| 2002/0108984 | A1* | 8/2002 | Miller | B65H 20/22 226/32 |
| 2009/0031562 | A1* | 2/2009 | Choi | H05K 13/021 29/832 |
| 2010/0186223 | A1* | 7/2010 | Watanabe | H05K 13/0413 29/740 |
| 2012/0285628 | A1 | 11/2012 | Katsumi et al. | |
| 2015/0047788 | A1* | 2/2015 | Kanda | H05K 13/0417 156/767 |
| 2016/0192548 | A1* | 6/2016 | Ohashi | H05K 13/0417 156/750 |
| 2016/0219762 | A1* | 7/2016 | Ohashi | H05K 13/0417 |

FOREIGN PATENT DOCUMENTS

| | | |
|---|---|---|
| JP | 2010 40901 | 2/2010 |
| JP | 2010 109109 | 5/2010 |
| JP | 2011 138834 | 7/2011 |
| WO | 2011 077880 | 6/2011 |

OTHER PUBLICATIONS

U.S. Appl. No. 14/380,568, filed Aug. 22, 2014, Koyanagi et al.
Extended Search Report dated Jun. 26, 2015 in European Patent Application 12871968.9.

* cited by examiner

[Fig.1]
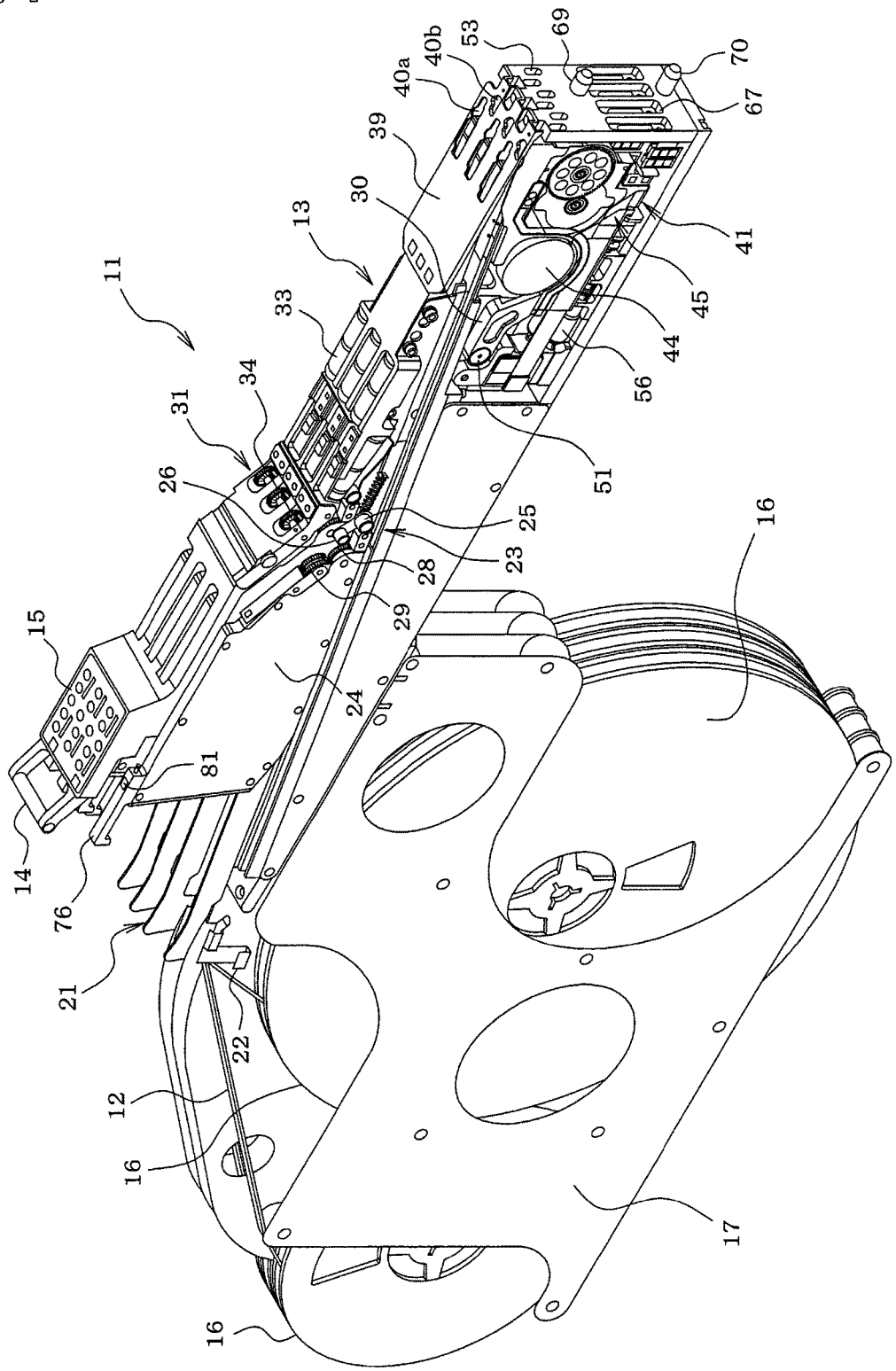

[Fig.2]
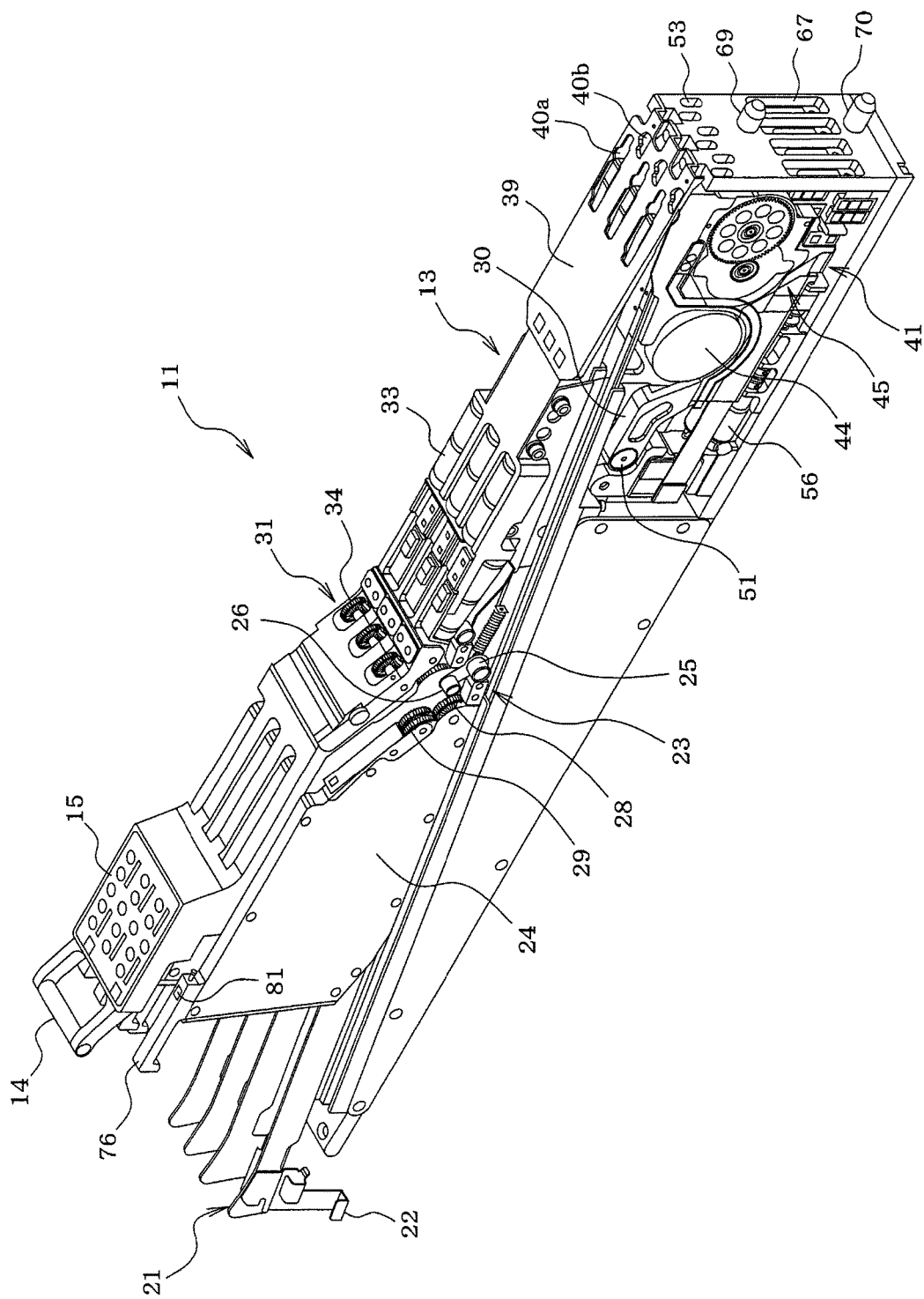

[Fig.3]
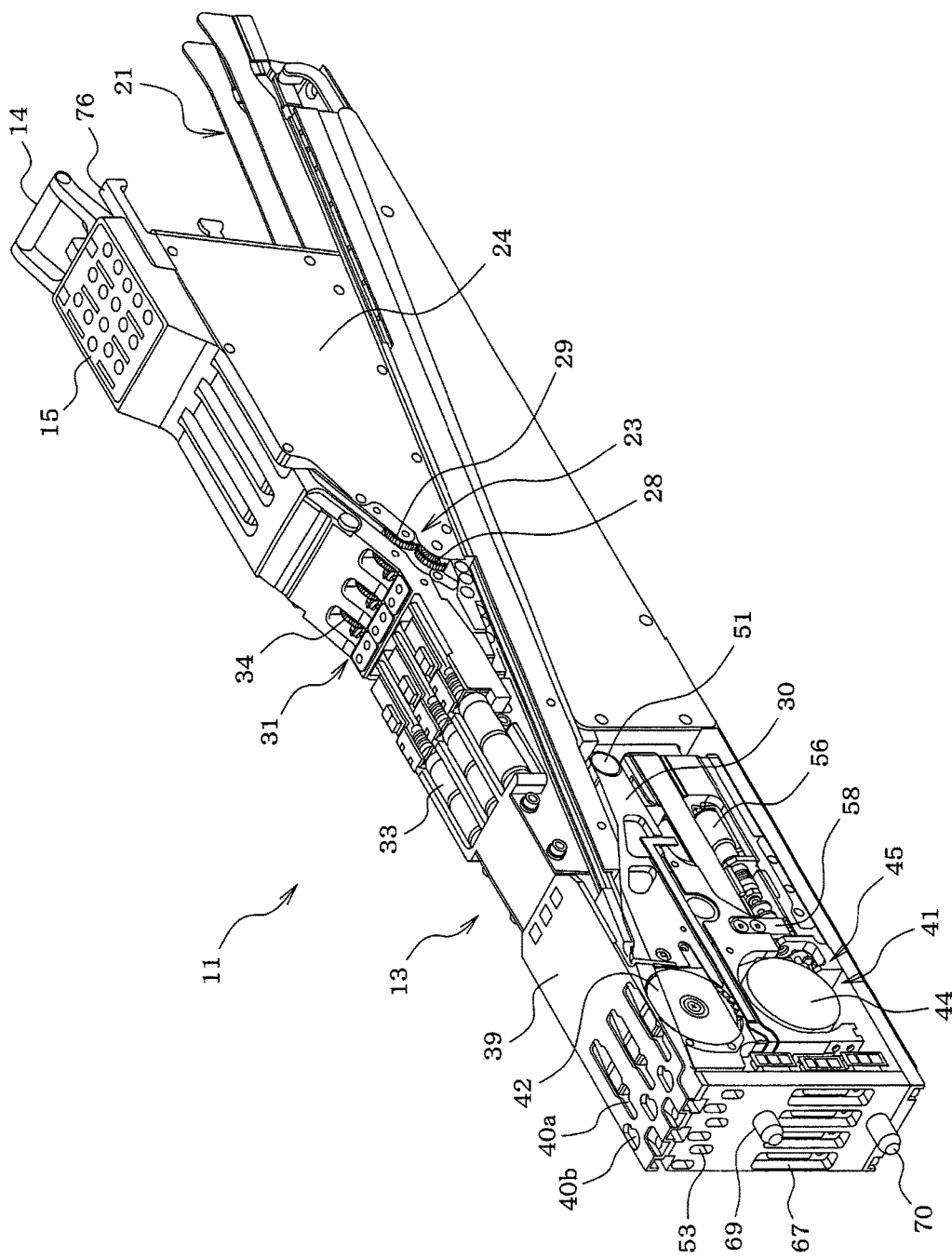

[Fig.4]
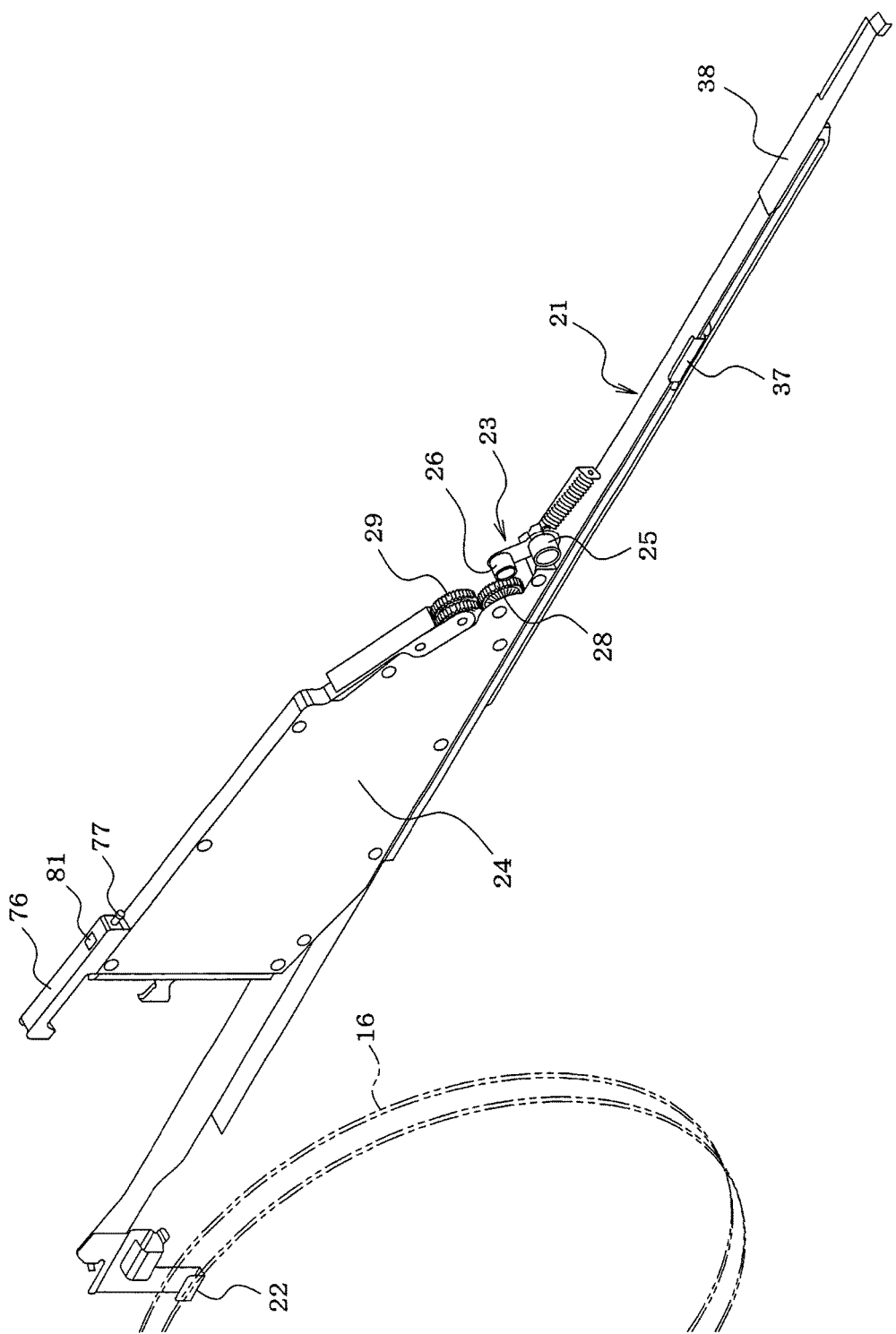

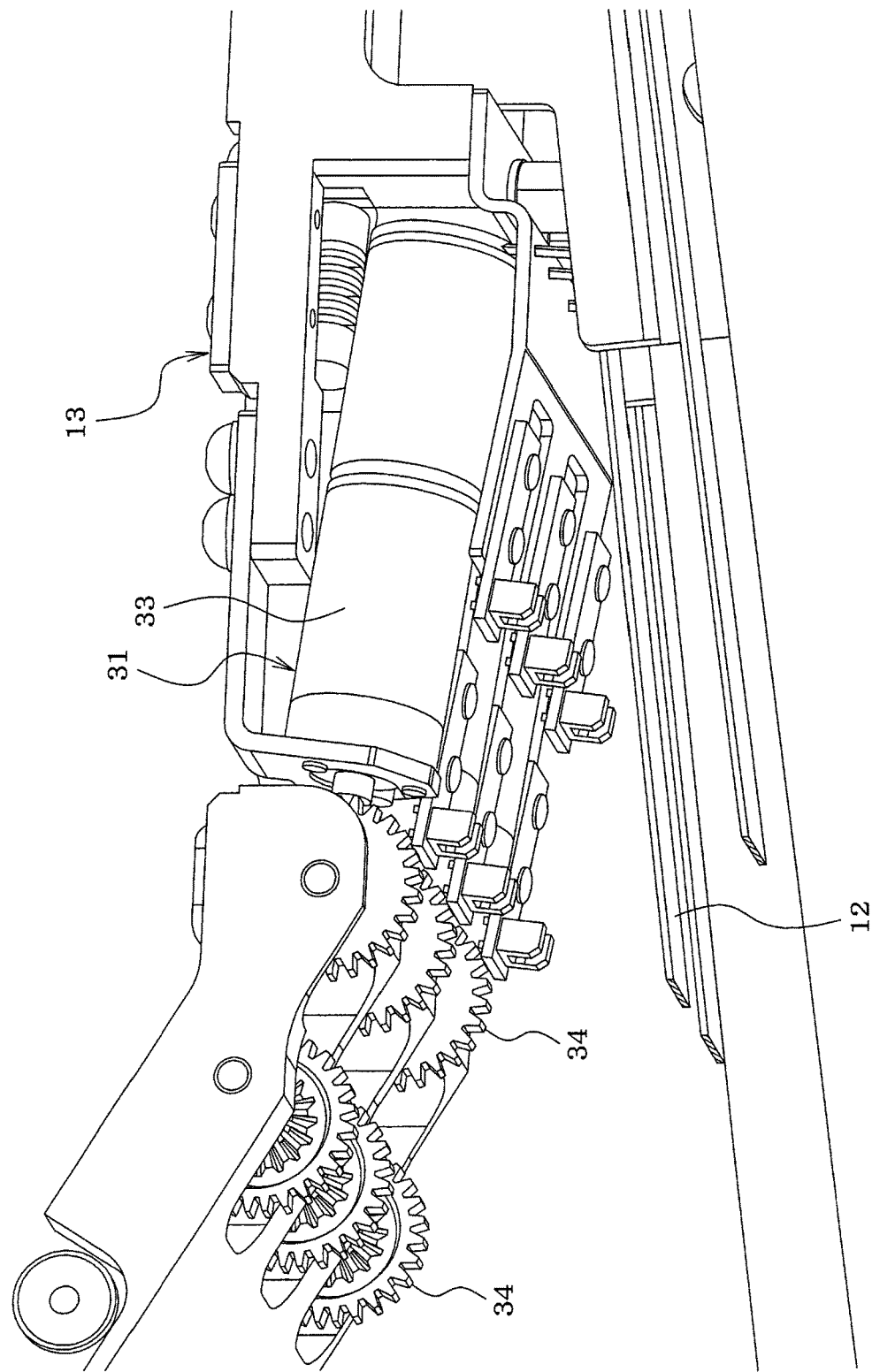
[Fig.5]

[Fig.6]
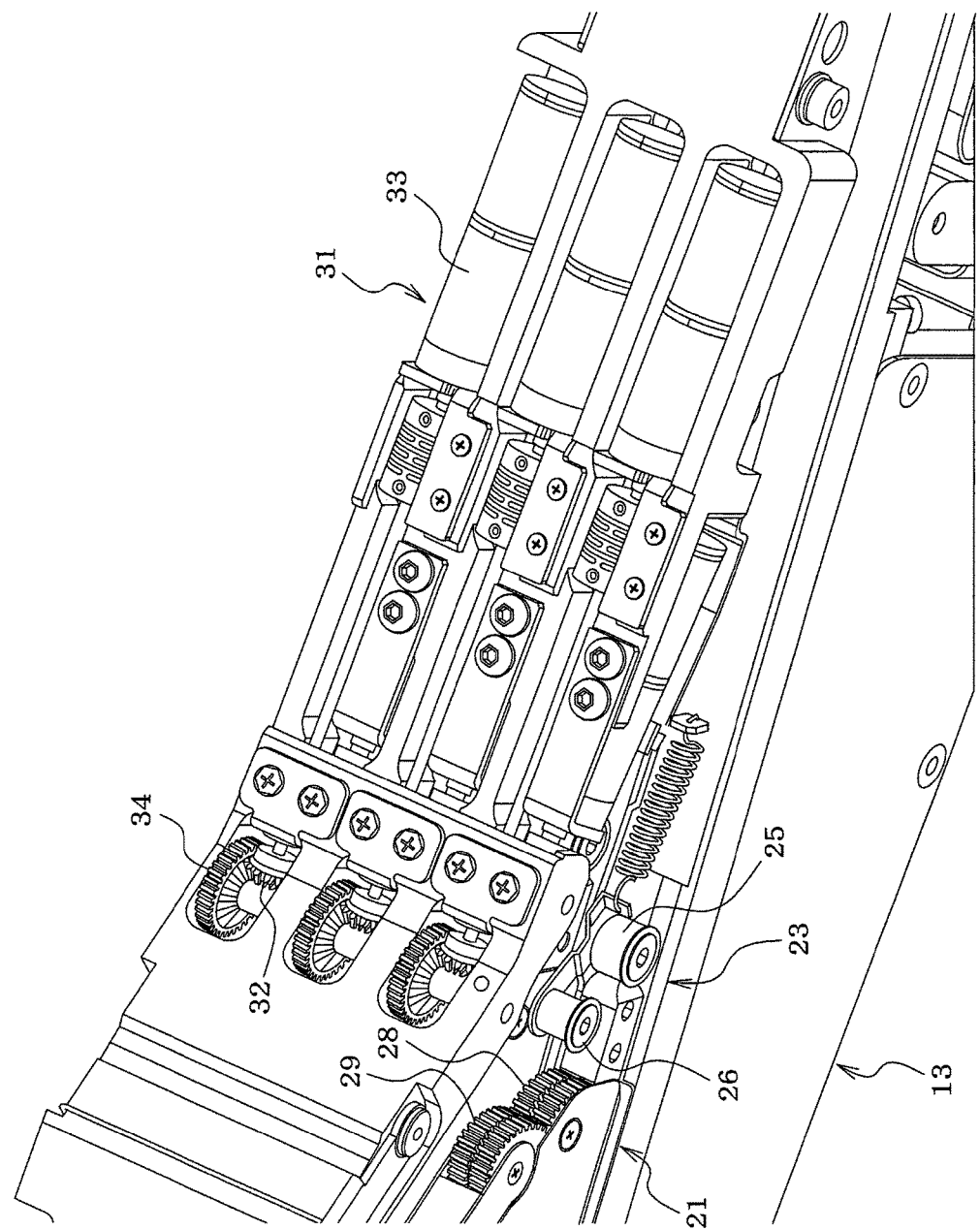

[Fig.7]
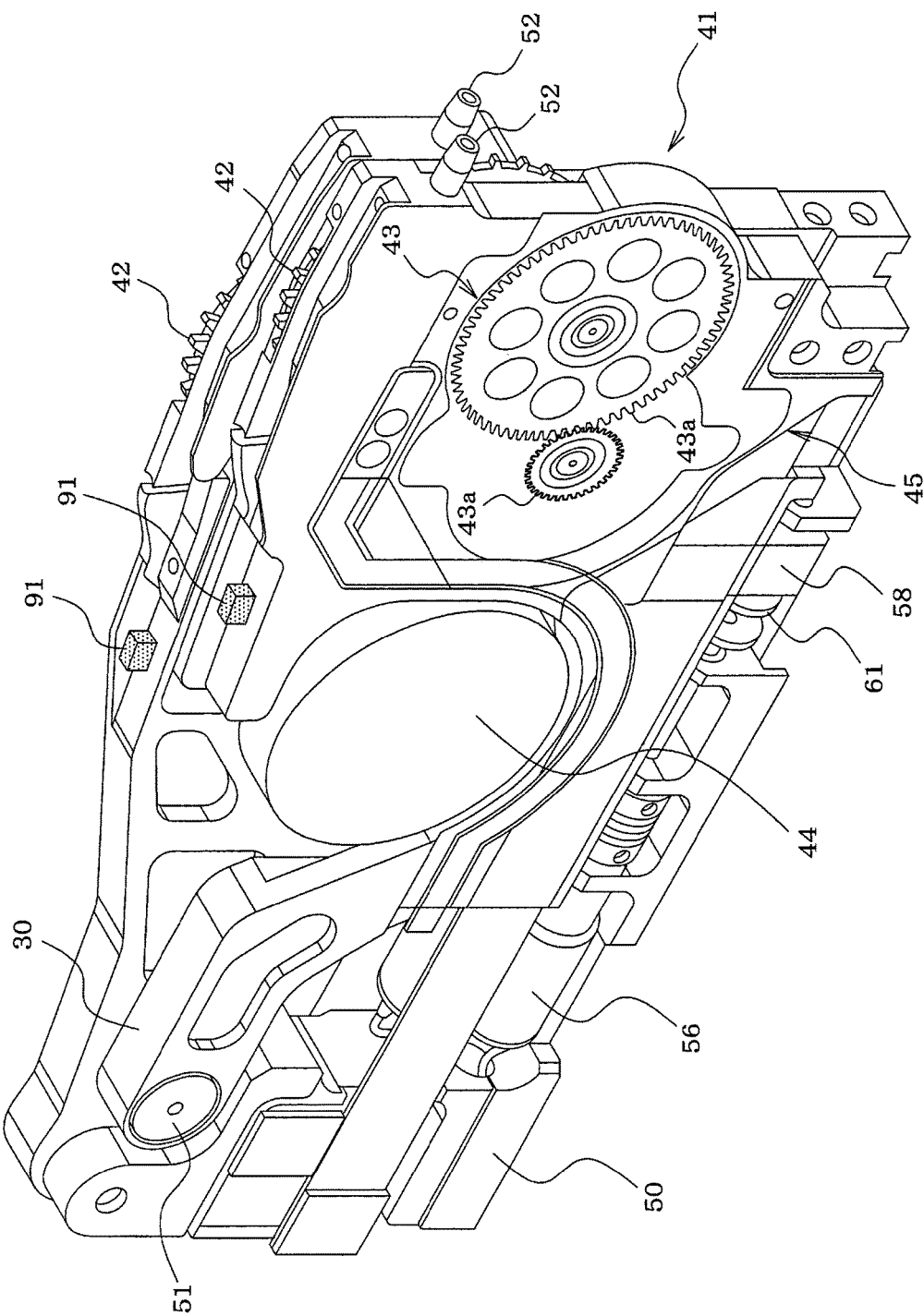

[Fig.8]
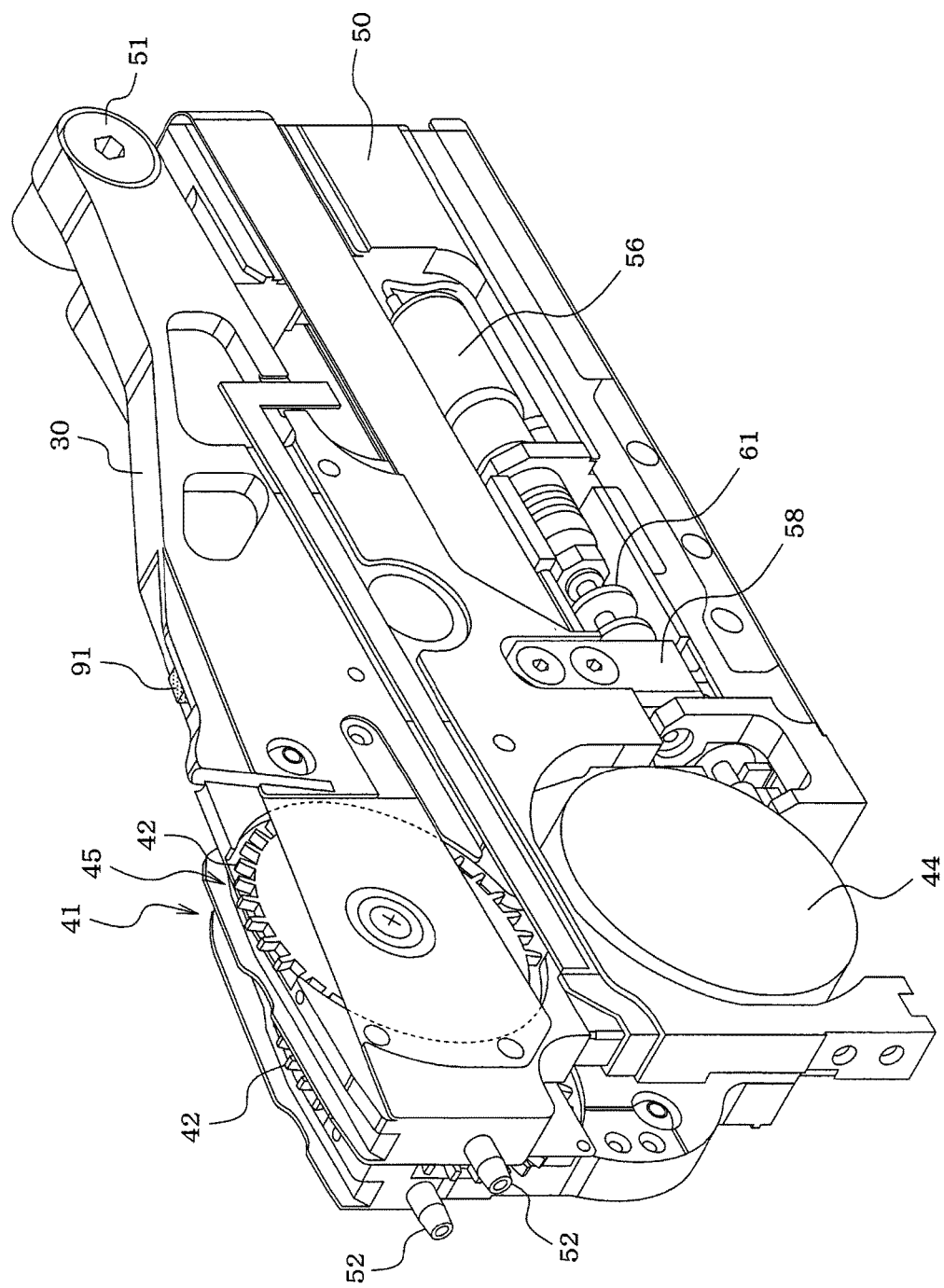

[Fig.9]
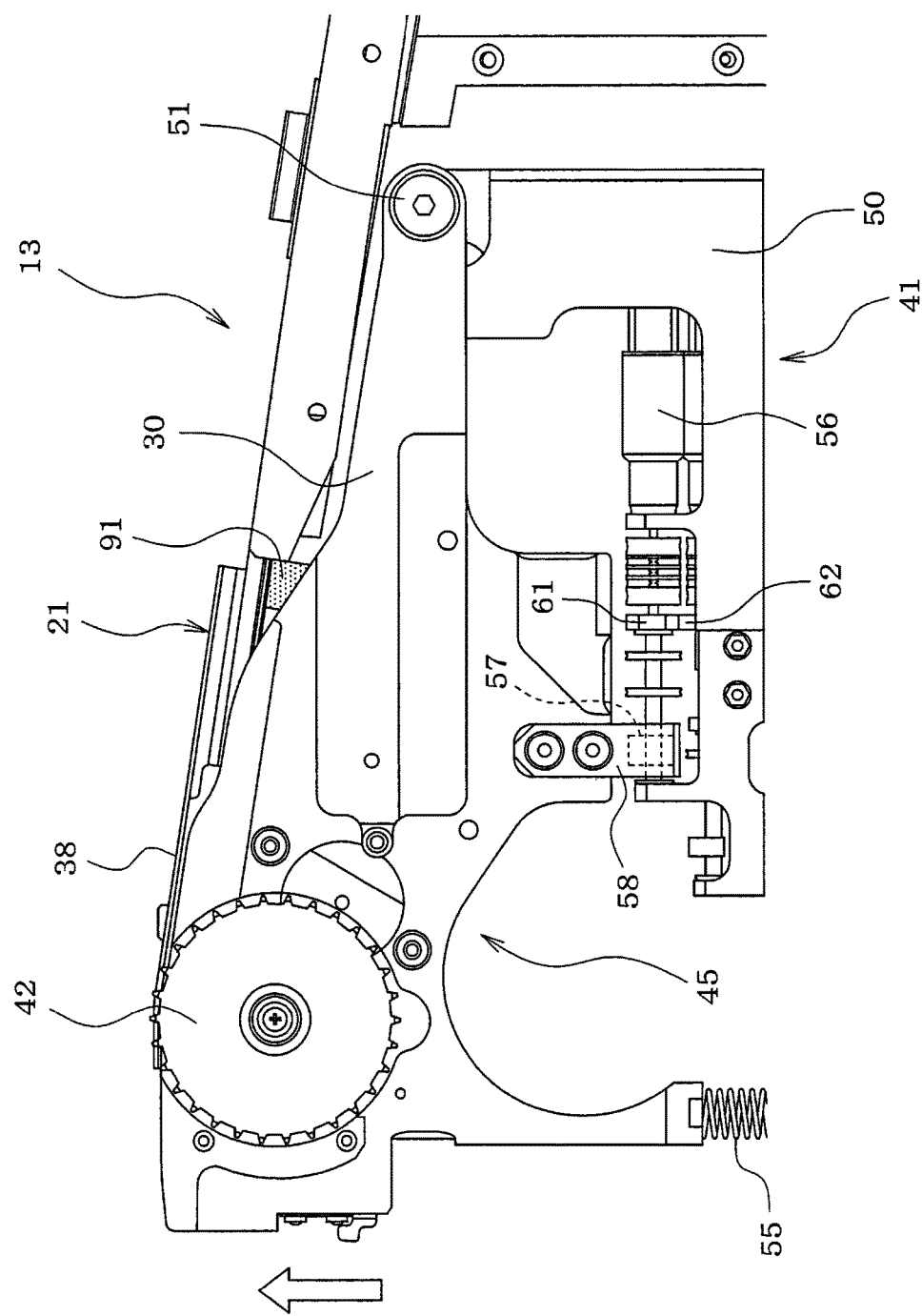

[Fig.10]
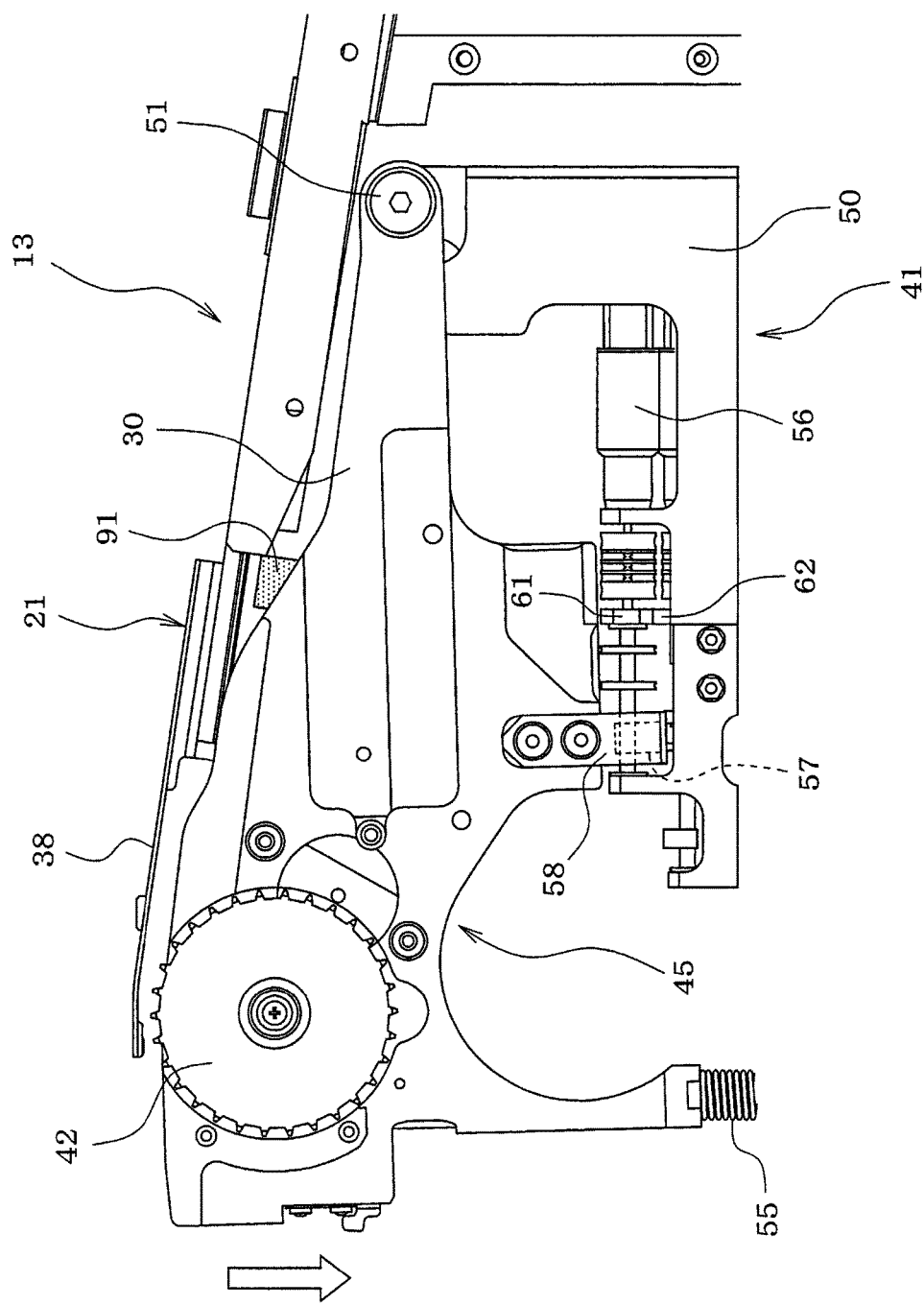

[Fig.11]
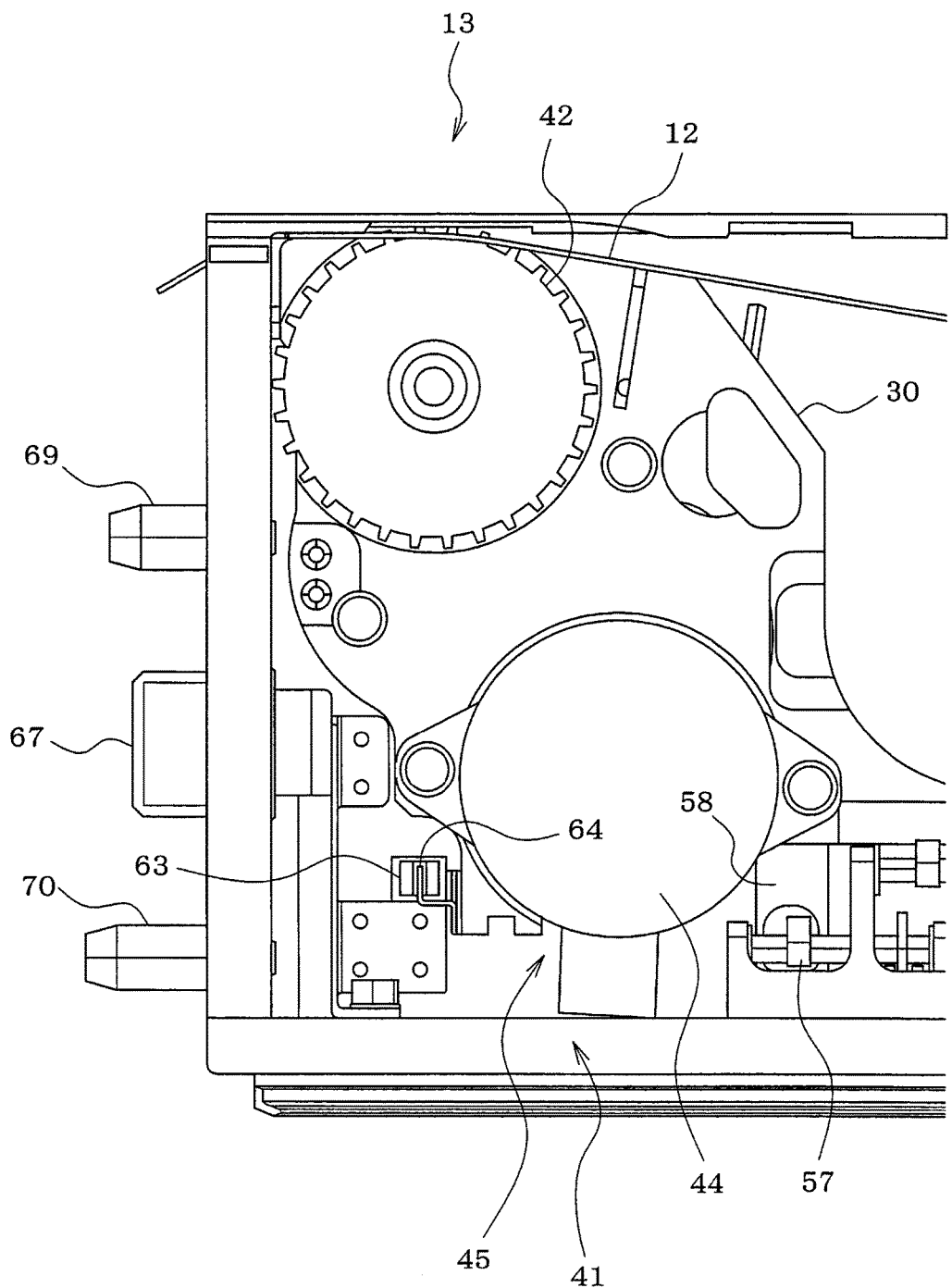

[Fig.12]
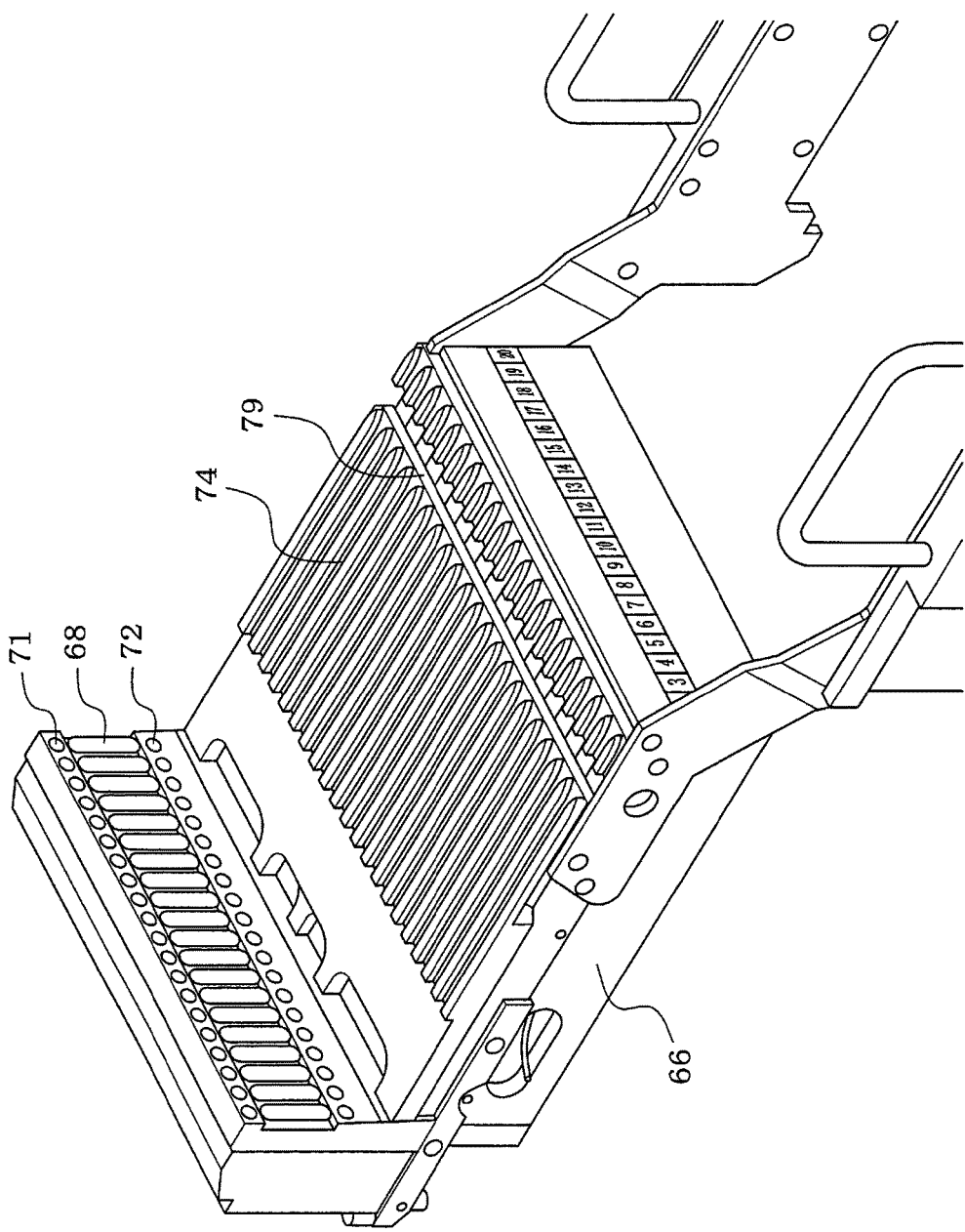

[Fig.13]
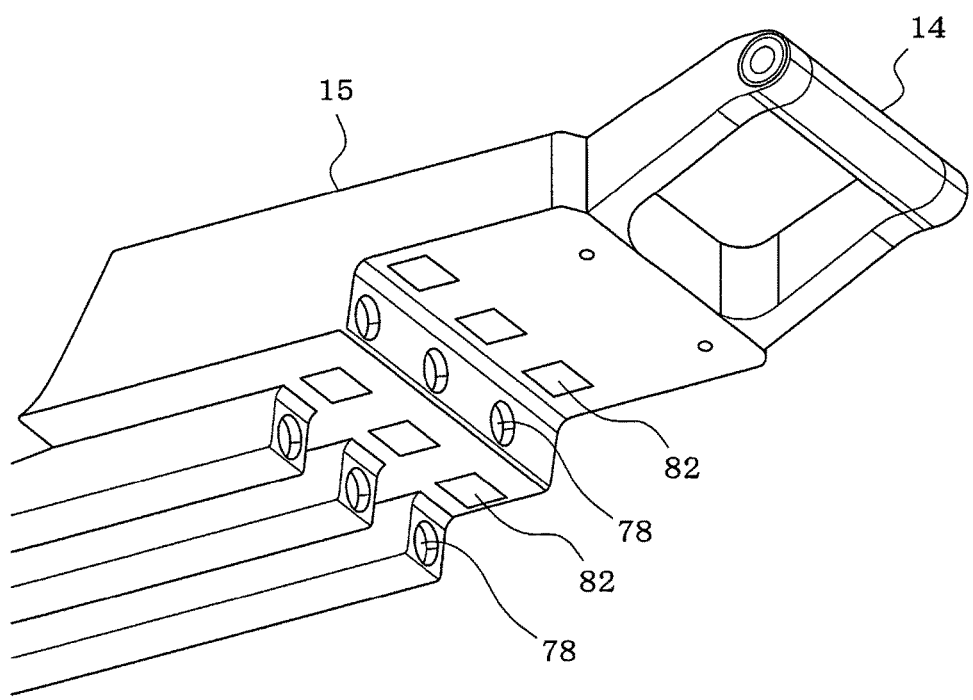

[Fig.14]
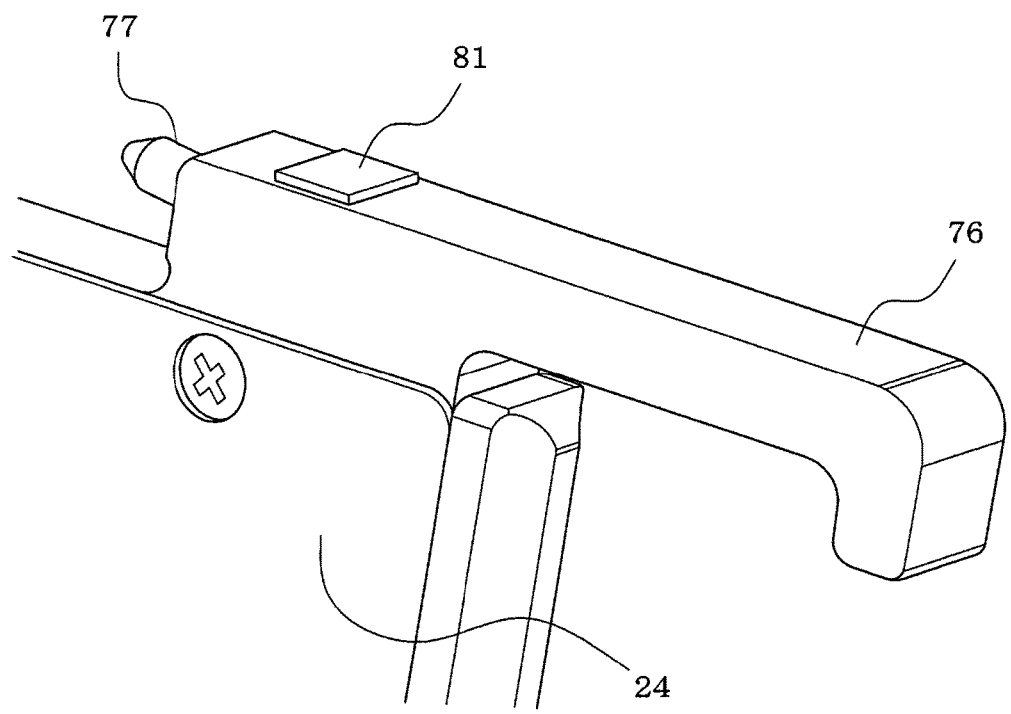

TAPE FEEDER

TECHNICAL FIELD

The present disclosure relates to a tape feeder that is configured so that a reel cassette, which guides a component supply tape drawn out from a tape reel to a component adsorption position, is removably mounted on a feeder main body.

BACKGROUND

In general tape feeders, a sprocket is rotated while teeth of the sprocket are engaged with sprocket holes that are formed at a constant pitch along a side edge of a component supply tape which is set in the tape feeder, as described in PTL 1 (JP-A-2010-109109), so that the component supply tape is pitch-fed toward a component adsorption position and a component in the component supply tape is adsorbed by an adsorption nozzle of a component mounter at the component adsorption position.

An operation for setting the component supply tape in the tape feeder is performed by removing the tape feeder from the component mounter, setting a tape reel around which the component supply tape is wound in the tape feeder, and causing the teeth of the sprocket to be engaged with the sprocket holes of the component supply tape which is drawn out from the tape reel.

However, the operation for setting the component supply tape in the tape feeder is troublesome according to the configuration of PTL 1 described above. In PTL 2 (JP-A-2011-138834) filed by the present applicant, a reel cassette that guides the component supply tape which is drawn out from the tape reel to the component adsorption position is removably disposed in a feeder main body. An operation lever mechanism is disposed for upward and downward movements of a sprocket driving unit that pitch-feeds the component supply tape to the component adsorption position. A clamp member (positioning member) that clamps the reel cassette so that an operator operates the operation lever mechanism, during mounting and removal of the reel cassette on and from the feeder main body, to lower the sprocket driving unit to a retract position where the teeth of the sprocket are positioned below the sprocket holes and the clamp member is retracted to an unclamp position for the reel cassette to be mounted on the feeder main body. Then the operator operates the operation lever mechanism to lift the sprocket driving unit to an engagement position where the teeth of the sprocket are in a state of being engaged with the sprocket holes of the component supply tape and the clamp member is moved to a clamp position for the reel cassette to be clamped.

CITATION LIST

Patent Literature

PTL 1: JP-A-2010-109109
PTL 2: JP-A-2011-138834

SUMMARY

Technical Problem

In the configuration of PTL 2 described above, the operator has to retract the sprocket driving unit and the clamp member by operating the operation lever mechanism, which is a troublesome operation, in a case where the reel cassette has to be removed from the feeder main body. Examples include when there is a shortage of the component in the component supply tape set in the reel cassette and when an error (for example, a component adsorption error, an image processing error, a feeding error of the feeder, a communication error, and an integrity error in usability inquiry during component verification) attributable to the supplied component occurs.

An object of the present disclosure is to provide a tape feeder where a reel cassette, which guides a component supply tape to a component adsorption position, is removably mounted on a feeder main body so that an operator can simply remove the reel cassette when the reel cassette has to be removed from the feeder main body.

Solution to Problem

In order to meet the above-described object, the disclosure provides a tape feeder that is configured so that a reel cassette, which guides a component supply tape drawn out from a tape reel to a component adsorption position, is removably mounted on a feeder main body. The tape feeder includes a sprocket driving mechanism portion that feeds the component supply tape to the component adsorption position by rotating a sprocket while causing teeth of the sprocket to be engaged with sprocket holes of the component supply tape, an actuator that moves the sprocket driving mechanism portion upward and downward between an engagement position where the teeth of the sprocket are in a state of being engaged with the sprocket holes of the component supply tape and a retract position where the teeth of the sprocket are positioned below the sprocket holes of the component supply tape, a clamp member that is moved upward and downward integrally with the sprocket driving mechanism portion, and clamps the reel cassette when the sprocket driving mechanism portion is lifted to the engagement position, and automatic clamp release means for performing automatic clamp release, in which a clamp state of the reel cassette by the clamp member is released, by operating the actuator and lowering the sprocket driving mechanism portion to the retract position when it is detected that the reel cassette has to be removed from the feeder main body.

In this configuration, the actuator is operated so that the sprocket driving mechanism portion is lowered to the retract position and the clamp state of the reel cassette by the clamp member is automatically released when the reel cassette has to be removed from the feeder main body. Accordingly, an operator can simply remove the reel cassette, without having to perform a clamp release operation, when the reel cassette has to be removed from the feeder main body.

Herein, it may be determined that the reel cassette has to be removed from the feeder main body and the automatic clamp release may be performed when there is a shortage of a component in the component supply tape and/or when an error (for example, a component adsorption error, an image processing error, a feeding error of the feeder, a communication error, and an integrity error in usability inquiry during component verification) attributable to the supplied component occurs. This is because the component supply tape has to be exchanged when there is the shortage of the component in the component supply tape and the component supply tape set in the reel cassette has to be checked to find out a cause of the error when the error attributable to the supplied component occurs.

In the present disclosure, only one reel cassette may be configured to be mounted on the feeder main body or a plurality of the reel cassettes may be configured to be mounted on the feeder main body. In a case where the plurality of reel cassettes are mounted, it maybe determined whether or not the reel cassette has to be removed from the feeder main body for each of the reel cassettes, and the automatic clamp release may be performed on only the reel cassette which has to be removed from the feeder main body.

In this case, a display unit may be disposed so as to display whether each of the reel cassettes is in a clamp release state or the clamp state. In this case, the display by the display unit allows the operator to simply distinguish the position of the reel cassette that has to be removed among the plurality of reel cassettes mounted on the feeder main body, and an erroneous removal of the reel cassette which does not have to be removed by the operator can be prevented in advance.

BRIEF DESCRIPTION OF DRAWINGS

FIG. 1 is an overall perspective view of a tape feeder according to an embodiment of the present disclosure.

FIG. 2 is a perspective view (1) of a feeder main body.

FIG. 3 is a perspective view (2) of the feeder main body.

FIG. 4 is a perspective view of a reel cassette.

FIG. 5 is a perspective view (1) illustrating a driving device of a cover tape feed gear and a part around the driving device.

FIG. 6 is a perspective view (2) illustrating the driving device of the cover tape feed gear and the part around the driving device.

FIG. 7 is a perspective view (1) of two sprocket driving units.

FIG. 8 is a perspective view (2) of the two sprocket driving units.

FIG. 9 is a side view of a main portion illustrating a clamp state of the reel cassette.

FIG. 10 is a side view of a main portion illustrating a clamp release state of the reel cassette.

FIG. 11 is a left side view illustrating a configuration of a device that drives a sprocket.

FIG. 12 is a perspective view of a feeder set table of a component mounter.

FIG. 13 is a perspective view illustrating a configuration of a lower surface side of an operation panel of the feeder main body.

FIG. 14 is an enlarged perspective view of a handle portion of the reel cassette and a part around the handle portion.

DESCRIPTION OF EMBODIMENTS

Hereinafter, an embodiment specifying a mode for embodying the present disclosure will be described with reference to drawings.

Firstly, a configuration of a tape feeder 11 will be described.

The tape feeder 11 is formed so that the lateral width of a feeder main body 13 is approximately a plurality of times wider than the lateral width of a general tape feeder according to the related art (tape feeder where only one component supply tape can be set) so that a plurality of component supply tapes 12 can be set side by side in a lateral width direction thereof. The present embodiment is configured so that six (N, N is an integer that is larger than M) component supply tapes 12 can be set side by side in the lateral width direction thereof, with the lateral width of the feeder main body 13 being, for example, approximately four times (approximately M times) the lateral width of the general tape feeder according to the related art, by narrowing a gap between the adjacent component supply tapes 12. The component supply tapes 12 (although not illustrated in detail) are formed by adhering a cover tape (also referred to as a top tape) on an upper surface of a carrier tape with a component being housed in a component housing concave portion which is formed in a row at a predetermined pitch in the carrier tape, and sprocket holes (not illustrated) are formed in a row at a predetermined pitch along side edges of the component supply tapes 12.

A handle portion 14 and an operation panel 15 are disposed in an upper portion on a back portion side (removal direction side) of the feeder main body 13, and a reel holder 17 that houses tape reels 16 around which the component supply tapes 12 are wound is disposed on a lower side thereof. The reel holder 17 is formed so that the plurality of tape reels 16 are housed side by side in two rows, forward and backward, and the respective tape reels 16 are housed to rotate in the reel holder 17 as the component supply tapes 12 are drawn out.

The component supply tapes 12 that are drawn out from the respective tape reels 16 are guided to a component adsorption position by reel cassettes 21. The reel cassettes 21 are formed so that the lateral width of each of the reel cassettes 21 is slightly larger in dimension than the lateral width of the component supply tapes 12 so that only one of the respective component supply tapes 12 is set in each of the reel cassettes 21.

A plurality of slots for a plurality of the reel cassettes 21 to be mounted are disposed in the feeder main body 13, and the feeder main body 13 is configured so that each of the reel cassettes 21 is removably mounted on each of the slots.

As illustrated in FIG. 4, a reel hook portion 22 is disposed in a back end portion of each of the reel cassettes 21 so that the tape reel 16 is held by the reel cassette 21 which is removed from the feeder main body 13, and the tape reel 16 can be hooked and held by the reel hook portion 22.

A cover tape peeling device 23 that peels the cover tape which covers an upper surface of the component supply tape 12 and a cover tape recovery case 24 that recovers the cover tape which is peeled from the component supply tapes 12 are disposed in the reel cassette 21. The cover tape peeling device 23 has a peeling roller 25, a tension roller 26, and a pair of cover tape feed gears 28 and 29, and the cover tape that is peeled from the upper surface of the component supply tape 12 right in front of the component adsorption position is fed into the cover tape recovery case 24, pinched between the cover tape feed gears 28 and 29, across the peeling roller 25 and the tension roller 26.

A driving source for the cover tape feed gears 28 and 29 is disposed on the feeder main body 13 side. When the reel cassette 21 is mounted on the feeder main body 13, the cover tape feed gear 28 is engaged with a driving gear 34 (refer to FIG. 5) of the feeder main body 13 so that both of the cover tape feed gears 28 and 29 are rotationally driven.

A driving device 31 that drives the cover tape feed gears 28 and 29 is disposed above a space in the feeder main body 13 where the reel cassettes 21 are mounted. The driving device 31 has a motor 33 that rotationally drives a bevel gear 32 (refer to FIG. 6) and the driving gear 34 that is rotationally driven by the bevel gear 32, and both of the cover tape feed gears 28 and 29 are rotationally driven when the driving gear 34 is engaged with the cover tape feed gear 28. The respective number of the motors 33, the bevel gears 32, and the driving gears 34 disposed are equal to the number of the reel cassettes 21 that can be mounted on the feeder main body 13, and the feed amount (peeling amount) of the cover tape can be independently controlled for each of the reel cassettes 21.

As illustrated in FIG. 4, in the reel cassette 21, a plurality of lateral U-shaped tape holding portions 37 and 38 that hold only one side of the component supply tape 12 in the width direction are alternately arranged in a zigzag shape on one side and the other side of the component supply tape 12 in the width direction. The component supply tape 12 can be held in a smaller width by arranging the respective tape holding portions 37 and 38 gradually closer to an inner side of the component supply tape 12 in the width direction so that the component supply tape 12 is held while the component supply tape 12 is slightly meandered (or inclined at an angle) in the width direction.

On a tip end portion side of the feeder main body 13, sprocket driving units 41 that are equal in number to the component supply tapes 12 which can be set in the feeder main body 13 are assembled side by side in the width direction. As described later, a sprocket driving mechanism portion 45 of each of the sprocket driving units 41 is configured by assembling a sprocket 42, a motor 44 that drives the sprocket 42 via a spur gear train 43 (gear mechanism), and the like in a lifting lever 30 (refer to FIGS. 7 to 10. The sprocket driving mechanism portions 45 are integrally moved upward and downward about a shaft 51 as a fulcrum. The sprockets 42 are arranged at positions of the respective reel cassettes 21 that are set in the feeder main body 13 which correspond to the component supply tapes 12, and the component supply tapes 12 are pitch-fed toward the component adsorption position by rotation of the sprockets 42 while teeth of the sprockets 42 are engaged with the sprocket holes of the respective component supply tapes 12.

In order to reduce the dimension of each of the sprocket driving units 41 in the width direction, positions of the sprockets 42 of the two adjacent sprocket driving units 41 are arranged to be shifted in a front-back direction and positions of respective gears 43a of the spur gear trains 43 of the two adjacent sprocket driving units 41 are arranged to be shifted as illustrated in FIGS. 7 and 8. In this case, an empty space of each of the sprocket driving units 41 can be used effectively as a space where the gears 43a of the adjacent sprocket driving units 41 can be arranged to protrude.

Next, a configuration of a mechanism that moves the sprocket driving mechanism portions 45 of the respective sprocket driving units 41 upward and downward independently from each other will be described.

As illustrated in FIGS. 7 to 10, the lifting lever 30 in which the sprocket driving mechanism portions 45 of the respective sprocket driving units 41 are assembled is configured to be assembled with a unit base 50 so that the sprocket 42 side can be moved upward and downward about the shaft 51 as a fulcrum and moved upward and downward between an engagement position where the teeth of the sprocket 42 are in a state of being engaged with the sprocket holes of the component supply tapes 12 and a retract position where the teeth of the sprockets 42 are positioned below the sprocket holes. Guide pins 52 that guide the upward and downward movement are disposed on tip end surfaces of the respective sprocket driving units 41, and a range within which each of the sprocket driving mechanism portions 45 can be moved upward and downward is regulated to be within a range between the engagement position and the retract position as the guide pins 52 are fitted into respective guide holes 53 (refer to FIG. 2) that are formed in a tip end surface portion of the feeder main body 13.

A spring 55 (elastic body such as a spring) as biasing means for biasing the sprocket 42 side of the sprocket driving mechanism portion 45 upward about the shaft 51 as a fulcrum is disposed in each of the sprocket driving units 41 as illustrated in FIGS. 9 and 10, and a resilient force of the spring 55 allows the sprocket driving mechanism portion 45 to be held at the engagement position that is an upper limit position. A motor 56 as an actuator that lowers the sprocket driving mechanism portion 45 against the spring 55 is disposed in each of the sprocket driving units 41.

A cam 57 (refer to FIG. 11) is fixed to a rotating shaft of each of the motors 56. Correspondingly, cam abutting members 58 that abut against the respective cams 57 from lower sides thereof and have an L shape or the like are disposed in the respective sprocket driving mechanism portions 45. When the cam 57 is rotated to a lowermost position (or a position in the vicinity thereof) by rotating the motor 56, the cam abutting member 58 is pulled down against the spring 55 integrally with the sprocket driving mechanism portion 45, and the sprocket driving mechanism portion 45 is held at the retract position that is a lower limit position. When the cam 57 is returned then to an uppermost position (or a position in the vicinity thereof) by rotating the motor 56 to an initial position, the sprocket driving mechanism portion 45 is pushed up by the resilient force of the spring 55 to follow the movement of the cam 57 and is held at a fitting position which is the upper limit position. In this case, the sprocket driving mechanism portion 45 may be pushed up by the resilient force of the spring 55 by cutting OFF power supply to the motor 56 and releasing a driving force of the motor 56.

Position detecting dogs 61 that detect the positions of the respective cams 57 are disposed in the rotating shafts of the respective motors 56. Correspondingly, cam position sensors 62 (optical sensors such as photo-interrupters and non-contact sensors such as magnetic sensors) that detect the respective position detecting dogs 61 are disposed in the respective sprocket driving units 41. Each of the cam position sensors 62 can detect whether the cam 57 is positioned at the fitting position (uppermost position) or the retract position (lowermost position).

In addition, engagement detecting sensors 63 (optical sensors such as photo-interrupters and non-contact sensors such as magnetic sensors) as engagement detecting means for detecting the lifting of the sprockets 42 of the sprocket driving mechanism portions 45 to the engagement position are disposed in the respective sprocket driving units 41 as illustrated in FIG. 11. Position detecting dogs 64 that detect the engagement position are disposed in the respective sprocket driving mechanism portions 45. The position detecting dog 64 of the sprocket driving mechanism portion 45 is configured to be detected by the engagement detecting sensor 63 and a detection signal is configured to be output when the teeth of the sprocket 42 of any one of the sprocket driving mechanism portions 45 are engaged with the sprocket holes of the component supply tape 12 and the sprocket 42 is in a state of being lifted to the engagement position.

A clamp member 91 that is formed of a material with a relatively high friction coefficient such as rubber is disposed on an upper end surface of the lifting lever 30 of each of the sprocket driving mechanism portions 45 as illustrated in FIGS. 7 to 10. When the sprocket driving mechanism portion 45 is lifted to the engagement position, an upper end surface of the clamp member 91 abuts against a lower surface of the reel cassette 21 to clamp the reel cassette 21 with a friction force as illustrated in FIG. 9. In addition, when the sprocket driving mechanism portion 45 is lowered to the retract position, the clamp member 91 retracts downward from the lower surface of the reel cassette 21 and the clamp state of the reel cassette 21 is released as illustrated in FIG. 10.

As illustrated in FIGS. 1 to 3, component adsorbing opening portions 40a and 40b (component adsorption position) that open the component adsorption position where the component in the component supply tape 12 is adsorbed by an adsorption nozzle of a component mounter are formed in a zigzag shape in an upper surface cover plate 39 which covers the sprocket driving unit 41 of the feeder main body 13 from above. In the present embodiment, a total of six component supply tapes 12 can be mounted on the feeder main body 13, and thus a total of six component adsorbing opening portions 40a and 40b are formed.

Connectors 67 that connect a signal line and a power supply line of the feeder main body 13 to connectors 68 (refer to FIG. 12) of a feeder set table 66 of the component mounter and two positioning pins 69 and 70 are disposed in the tip end surface of the feeder main body 13. When the two positioning pins 69 and 70 are inserted into positioning holes 71 and 72 (refer to FIG. 12) of the feeder set table 66 of the component mounter, a mounting position of the feeder main body 13 is positioned on the feeder set table 66 and the connectors 67 of the feeder main body 13 are inserted into and connected to the connectors 68 of the feeder set table 66.

Guide grooves 74 that vertically support the tape feeder 11 and have an inverted T groove-shaped cross section are disposed on an upper surface of the feeder set table 66. When guide rails (not illustrated) that are disposed on a lower surface of the feeder main body 13 and have an inverted T-shaped cross section are inserted from a front side into the guide grooves 74, the tape feeder 11 is supported in a vertical state on the feeder set table 66 and a lock member (not illustrated) that is disposed in the feeder main body 13 is fitted into clamp grooves 79 of the feeder set table 66 to push the feeder main body 13 forward (connector 68 side of the feeder set table 66) and lock the feeder main body 13. In this manner, the feeder main body 13 is positioned in the front-back direction on the feeder set table 66 and is removably mounted.

Handle portions 76 are disposed in upper end back portions of the cover tape recovery cases 24 of the respective reel cassettes 21, and a positioning pin 77 (refer to FIG. 14) is disposed in a front tip portion of each of the handle portions 76. Correspondingly, positioning holes 78 (refer to FIG. 13) are formed at a lower side step part of the operation panel 15 of the feeder main body 13. When the reel cassette 21 is set in the feeder main body 13, the positioning pin 77 of the handle portion 76 is inserted into the positioning hole 78 on a lower side of the operation panel 15 so that the handle portion is positioned with respect to a lower surface of the operation panel 15. In this case, an operation for mounting the reel cassette 21 on the feeder main body 13 can be performed in a state where the tape feeder 11 is set on the feeder set table 66 of the component mounter.

An RF tag 81 (also referred to as an electronic tag, an IC tag, a radio tag, or a wireless tag) that stores identification information (hereinafter, referred to as a "reel cassette ID") of the reel cassette 21 is mounted on an upper surface of the handle portion 76 as illustrated in FIG. 14. Not only the reel cassette ID but also component information of the component supply tapes 12 and the like may be stored in the RF tag 81.

Correspondingly, readers 82 (refer to FIG. 13) that read the reel cassette ID which is stored in the RF tag 81 are disposed on the lower surface side of the operation panel 15 of the feeder main body 13. When the reel cassette 21 is set in the feeder main body 13 and the positioning pin 77 of the handle portion 76 is in a state of being inserted into the positioning hole 78 on the lower side of the operation panel 15, the RF tag 81 on the upper surface of the handle portion 76 approaches and faces the readers 82 on the lower surface of the operation panel 15 and the reel cassette ID stored in the RF tag 81 is read by the readers 82.

A reel cassette ID signal that is output from the reader 82 also serves as a signal for checking the setting of the reel cassette 21 to the feeder main body 13. When the reel cassette ID is read by the reader 82, the setting of the reel cassette 21 to the feeder main body 13 is checked. With respect to the readers 82 to be arranged on the lower surface side of the operation panel 15, at least antennas of the readers 82 may be arranged, and control circuit portions of the readers 82 may be separated from the antennas and arranged at another part.

Operation keys such as reel cassette mounting operation initiation keys are disposed on the operation panel 15 for the respective reel cassettes 21. Also, a display unit that displays whether a mounting state of the reel cassette 21 is the clamp state or the clamp release state is disposed on the operation panel 15.

A control device (not illustrated) that controls operations of each of the motors 33, 44, and 56 and the like is disposed in the feeder main body 13. The reel cassette ID that is read by the reader 82 is transmitted to the control device of the feeder main body 13 and is transmitted from the control device of the feeder main body 13 to a control device (not illustrated) of the component mounter through the connectors 67 and 68, and it is checked whether or not the reel cassette 21 is the reel cassette 21 which is designated in a production job (production program)

A procedure for setting the reel cassette 21 in the feeder main body 13 is as follows. When an operator operates the reel cassette mounting operation initiation key on the operation panel 15, the following control is performed by the control device of the feeder main body 13. Firstly, the motor 56 for moving the sprocket driving mechanism portion upward and downward is operated so that the sprocket driving mechanism portion 45 is pulled down against the spring 55 and the sprocket 42 is lowered to the retract position as illustrated in FIG. 10. In this case, the engagement of the sprocket 42 with the sprocket hole of the component supply tape 12 is released and the clamp member 91 is retracted downward from the reel cassette 21 to release the clamp state of the reel cassette 21.

When the operator completes the mounting of the reel cassette 21 on the feeder main body 13 in this state, the reader 82 of the feeder main body 13 reads the reel cassette ID from the RF tag 81 of the reel cassette 21 and it is determined that the operation for mounting the reel cassette 21 on the feeder main body 13 is completed. Then, the motor 56 for moving the sprocket driving mechanism portion upward and downward is rotated to the initial position and the cam 57 is returned to the uppermost position (or a position in the vicinity thereof) so that the sprocket driving mechanism portion 45 is lifted to the fitting position by the resilient force of the spring 55 to follow the movement of the cam 57. Then, the power supply to the motor 56 is cut OFF.

Then, it is distinguished whether or not the teeth of the sprocket 42 are engaged with the sprocket holes of the component supply tapes 12 from whether or not the detection signal is output from the engagement detecting sensor 63 at a point of time when the cam position sensor 62 detects the returning of the cam 57 to the vicinity of the fitting position (uppermost position). If the detection signal is output from the engagement detecting sensor 63, the teeth of the sprocket 42 are determined to be engaged with the sprocket holes of the component supply tapes 12, and an automatic engagement operation is completed. In this case, the foremost component in the component supply tape 12 may be positioned with respect to the component adsorption position by appropriately rotating the sprocket 42. In a state where the teeth of the sprocket 42 are engaged with the sprocket holes of the component supply tapes 12, the upper end surface of the clamp member 91 is in a state of abutting against the lower surface of the reel cassette 21 and clamping the reel cassette 21 with a friction force as illustrated in FIG. 9.

In contrast, if no detection signal is output from the engagement detecting sensor 63, the teeth of the sprocket 42 are determined not to be engaged with the sprocket holes of the component supply tapes 12 yet. In this case, the motor 44 is subjected to reverse rotation so that the sprocket 42 is subjected to reverse rotation by a predetermined angle, and then it is determined whether or not the detection signal is output from the engagement detecting sensor 63. If the detection signal is not output, the teeth of the sprocket 42 are determined not to be engaged with the sprocket holes of the component supply tapes 12 yet, and the motor 44 is subjected to reverse rotation so that the processing for the reverse rotation of the sprocket 42 by the predetermined angle is repeated. The processing for the reverse rotation of the sprocket 42 by the predetermined angle with the motor 44 is repeated in this manner until the detection signal is output from the engagement detecting sensor 63. The teeth of the sprocket 42 are determined to be engaged with the sprocket holes of the component supply tapes 12 at a point of time when the detection signal is output from the engagement detecting sensor 63. Then, the motor 44 is subjected to forward rotation so that the sprocket 42 is subjected to forward rotation, the foremost component in the component supply tape 12 is positioned with respect to the component adsorption position, and the automatic engagement operation is completed.

When there is a shortage of the component in the component supply tape 12 and when an error (for example, a component adsorption error, an image processing error, an error in feeding the component supply tape 12, a communication error, or an integrity error in usability inquiry during component verification) attributable to the supplied component occurs, information about the position of the reel cassette 21 where the component shortage and the error occur and a component replenishment signal or an error signal are transmitted from the control device of the component mounter to the control device of the feeder main body 13. When the control device of the feeder main body 13 (automatic clamp release means) receives the component replenishment signal and the error signal that are transmitted from the control device of the component mounter, the control device of the feeder main body 13 removes the reel cassette 21 where the component shortage and the error occur from the feeder main body 13, determines that the state of the component supply tape 12 of the reel cassette 21 has to be checked, and performs automatic clamp release as follows only on the reel cassette 21 which has to be removed.

Firstly, the motor 56 for moving the sprocket driving mechanism portion upward and downward that corresponds to the reel cassette 21 where the component shortage and the error occur among the plurality of reel cassettes 21 is operated so that the sprocket driving mechanism portion 45 is pulled down against the spring 55 and the sprocket 42 is lowered to the retract position as illustrated in FIG. 10. In this manner, the engagement of the sprocket 42 with the sprocket hole of the component supply tape 12 is released, and the clamp member 91 is retracted downward from the reel cassette 21 so that the clamp state of the reel cassette 21 is released. Moreover, the display unit of the operation panel 15 displays whether each of the reel cassettes 21 is in the clamp release state or the clamp state. In other words, it is displayed that only the reel cassette 21 subjected to the automatic clamp release is in the clamp release state.

In the present embodiment described above, the sprocket driving mechanism portion 45 is lowered to the retract position by the motor 56 for moving the sprocket driving mechanism portion upward and downward and the clamp state of the reel cassette 21 by the clamp member 91 is automatically released when the reel cassette 21 has to be removed from the feeder main body 13. Accordingly, the reel cassette 21 can be simply removed, without the operator having to perform the clamp release operation, when the reel cassette 21 has to be removed from the feeder main body 13.

In addition, in the present embodiment, the display unit is disposed on the operation panel 15 of the feeder main body 13 so as to display whether each of the reel cassettes 21 is in the clamp release state or the clamp state. Accordingly, the display by the display unit allows the operator to simply distinguish the position of the reel cassette 21 that has to be removed among the plurality of reel cassettes 21 mounted on the feeder main body 13, and an erroneous removal of the reel cassette 21 which does not have to be removed by the operator can be prevented in advance.

In addition, according to the configuration of the present embodiment, the plurality of sprocket driving units 41 are disposed in the feeder main body 13, each of the plurality of reel cassettes 21 is independently and removably mounted on the feeder main body 13, and the teeth of the sprockets 42 of the sprocket driving units 41 are respectively engaged with the sprocket holes of the component supply tapes 12 set in the respective reel cassettes 21. Accordingly, there is an advantage that only the component supply tape 12 that is subjected to the component shortage among the plurality of component supply tapes 12 which are set in the feeder main body 13 mounted on the feeder set table 66 of the component mounter can be removed from the feeder main body 13 along with the reel cassette 21, and the component supply tape 12 can be replaced with a new component supply tape 12.

The present embodiment may also be configured so that only one sprocket driving unit 41 is disposed in the feeder main body 13 and only one reel cassette 21 is removably mounted on the feeder main body 13.

In addition, in the present embodiment, the reel holder 17 is disposed in the feeder main body 13 so as to collectively house the plurality of tape reels 16. However, reel holders may be configured to be disposed in the respective reel cassettes 21 so as to house the respective tape reels 16.

In addition, in the present embodiment, it is determined that the reel cassette 21 has to be removed from the feeder main body 13 and the automatic clamp release is performed when there is the shortage of the component in the component supply tape 12 and when the error attributable to the supplied component occurs. However, for example, it may be determined that the reel cassette 21 has to be removed from the feeder main body 13 and the automatic clamp release may be performed when exchange of the reel cassettes 21 (exchange of the supplied components) is ordered by the production job (production program).

In addition, the present disclosure is not limited to the embodiment described above and various modifications can be made without departing from the scope of the present disclosure. For example, the number of the reel cassettes 21 that can be mounted on the feeder main body 13 (the number of the sprocket driving units 41) may be changed, and the sprocket driving mechanism portions 45 may be configured to be slidingly moved in an up-and-down direction.

REFERENCE NUMBER LIST

11 Tape feeder, 12 Component supply tape, 13 Feeder main body, 14 Handle portion, 15 Operation panel, 16 Tape reel, 17 Reel holder, 21 Reel cassette, 22 Reel hook portion, 23 Cover tape peeling device, 24 Cover tape recovery case, 25 Peeling roller, 28, 29 Cover tape feed gear, 31 Driving device, 33 Motor, 34 Driving gear, 37, 38 Tape holding portion, 41 Sprocket driving unit, 42 Sprocket, 43 Spur gear train (gear mechanism), 44 Motor, 45 Sprocket driving mechanism portion, 51 Shaft, 52 Guide pin, 53 Guide hole, 55 Spring (biasing means), 56 Motor (actuator), 57 Cam, 58 Cam abutting member, 61 Position detecting dog, 62 Cam position sensor, 63 Engagement detecting sensor (engagement detecting means), 64 Position detecting dog, 66 Feeder mounting table, 67, 68 Connector, 69, 70 Positioning pin, 71, 72 Positioning hole, 74 Guide groove, 76 Handle portion, 77 Positioning pin, 78 Positioning hole, 81 RF tag, 82 Reader, 91 Clamp member

The invention claimed is:

1. A tape feeder configured so that a reel cassette, which guides a component supply tape drawn out from a tape reel to a component adsorption position, is removably mounted on a feeder main body, the tape feeder comprising:
   a sprocket driving mechanism portion that feeds the component supply tape to the component adsorption position by rotating a sprocket while causing teeth of the sprocket to be engaged with sprocket holes of the component supply tape;
   an actuator that moves the sprocket driving mechanism portion upward and downward between an engagement position where the teeth of the sprocket are in a state of being engaged with the sprocket holes of the component supply tape and a retract position where the teeth of the sprocket are positioned below the sprocket holes of the component supply tape;
   a clamp member that is moved upward and downward integrally with the sprocket driving mechanism portion, and clamps the reel cassette when the sprocket driving mechanism portion is lifted to the engagement position; and
   automatic clamp release means for performing automatic clamp release, in which a clamp state of the reel cassette by the clamp member is released, by operating the actuator and lowering the sprocket driving mechanism portion to the retract position when it is detected that the reel cassette has to be removed from the feeder main body.

2. The tape feeder according to claim 1,
   wherein the automatic clamp release means determines that the reel cassette has to be removed from the feeder main body and performs the automatic clamp release when there is at least one of a shortage of a component in the component supply tape and an error attributable to the supplied component occurs.

3. The tape feeder according to claim 1,
   wherein a plurality of the sprocket driving mechanism portions, a plurality of the actuators, and a plurality of the clamp members are disposed in the feeder main body,
   wherein a plurality of reel cassettes are removably mounted on the feeder main body independently from each other, and the teeth of the sprocket of the respective sprocket driving mechanism portions are engaged with the sprocket holes of the component supply tapes of the respective reel cassettes and the respective reel cassettes are configured to be clamped by the respective clamp members when the respective sprocket driving mechanism portions are lifted to the engagement position, and
   wherein the automatic clamp release means determines whether or not the reel cassette has to be removed from the feeder main body for each of the reel cassettes and performs the automatic clamp release only for the reel cassette which has to be removed from the feeder main body.

4. The tape feeder according to claim 3,
   wherein an operation panel is disposed so as to display whether each of the reel cassettes is in a clamp release state or the clamp state.

5. The tape feeder according to claim 2,
   wherein a plurality of the sprocket driving mechanism portions, a plurality of the actuators, and a plurality of the clamp members are disposed in the feeder main body,
   wherein a plurality of the reel cassettes are removably mounted on the feeder main body independently from each other, and the teeth of the sprockets of the respective sprocket driving mechanism portions are engaged with the sprocket holes of the component supply tapes of the respective reel cassettes and the respective reel cassettes are configured to be clamped by the respective clamp members when the respective sprocket driving mechanism portions are lifted to the engagement position, and
   wherein the automatic clamp release means determines whether or not the reel cassette has to be removed from the feeder main body for each of the reel cassettes and performs the automatic clamp release only for the reel cassette which has to be removed from the feeder main body.

6. A tape feeder configured so that a reel cassette, which guides a component supply tape drawn out from a tape reel to a component adsorption position, is removably mounted on a feeder main body, the tape feeder comprising:
   a sprocket driving mechanism portion that feeds the component supply tape to the component adsorption position by rotating a sprocket while causing teeth of the sprocket to be engaged with sprocket holes of the component supply tape;
   an actuator that moves the sprocket driving mechanism portion upward and downward between an engagement position where the teeth of the sprocket are in a state of being engaged with the sprocket holes of the component supply tape and a retract position where the teeth of the sprocket are positioned below the sprocket holes of the component supply tape;
   a clamp member that is moved upward and downward integrally with the sprocket driving mechanism portion, and clamps the reel cassette when the sprocket driving mechanism portion is lifted to the engagement position; and a controller programmed to perform automatic clamp release, in which a clamp state of the reel cassette by the clamp member is released, by operating the actuator and lowering the sprocket driving mechanism portion to the retract position when it is detected that the reel cassette has to be removed from the feeder main body.

* * * * *